(12) United States Patent
Chinn et al.

(10) Patent No.: US 8,067,258 B2
(45) Date of Patent: Nov. 29, 2011

(54) PROTECTIVE THIN FILMS FOR USE DURING FABRICATION OF SEMICONDUCTORS, MEMS, AND MICROSTRUCTURES

(75) Inventors: Jeffrey D. Chinn, Foster City, CA (US); Boris Kobrin, Dublin, CA (US); Romuald Nowak, Cupertino, CA (US)

(73) Assignee: Applied Microstructures, Inc., San Jose, CA (US)

( * ) Notice: Subject to any disclaimer, the term of this patent is extended or adjusted under 35 U.S.C. 154(b) by 670 days.

(21) Appl. No.: 11/447,186

(22) Filed: Jun. 5, 2006

(65) Prior Publication Data

US 2007/0281492 A1    Dec. 6, 2007

(51) Int. Cl.
*H01L 21/00*    (2006.01)
(52) U.S. Cl. ............... 438/48; 438/51; 438/55; 438/64; 438/68; 257/E21.001
(58) Field of Classification Search .............. 438/48, 438/51, 68, 55, 64; 257/E21.001
See application file for complete search history.

(56) References Cited

U.S. PATENT DOCUMENTS

| | | | | |
|---|---|---|---|---|
| 5,527,744 | A * | 6/1996 | Mignardi et al. | 216/2 |
| 6,806,993 | B1 | 10/2004 | Adams et al. | 359/291 |
| 6,979,893 | B2 | 12/2005 | Dunphy et al. | 257/682 |
| 7,009,745 | B2 | 3/2006 | Miller et al. | 359/212 |
| 2004/0261703 | A1* | 12/2004 | Kobrin et al. | 118/715 |
| 2005/0012975 | A1* | 1/2005 | George et al. | 359/223 |
| 2005/0260793 | A1 | 11/2005 | Patel et al. | 438/107 |
| 2006/0007515 | A1 | 1/2006 | Simonian et al. | 359/245 |
| 2006/0038269 | A1 | 2/2006 | Dunphy et al. | 257/682 |
| 2007/0232062 | A1* | 10/2007 | Nogami | 438/638 |
| 2008/0032403 | A1* | 2/2008 | Saito et al. | 435/402 |

FOREIGN PATENT DOCUMENTS

| JP | 2004-261216 | * | 9/2004 |
|---|---|---|---|
| WO | WO2006028274 | * | 3/2006 |

OTHER PUBLICATIONS

W.R. Ashurst et al., "Vapor Phase Anti-Stiction Monolayer Coatings for MEMS", TDMR-Draft, pp. 1-6 (Sep. 2003).
C.F. Herriman et al., "Hydrophobic Coatings Using Atomic Layer Deposition and Non-Chlorinated Precursors", 0-7803-8265-X/04 © 2004 IEEE.
M. G. Hankins, "Vapor Deposition of Amino-Functionalized Self-Assembled Monolayers on MEMS", Reliability, Testing, and Characterization of MEMS/MOEMS, Proceedings of SPIE, vol. 4980, pp. 238-247 (2003).

* cited by examiner

*Primary Examiner* — Thanh Nguyen
(74) *Attorney, Agent, or Firm* — Martine Penilla Group, LLP

(57) ABSTRACT

A method of protecting a substrate during fabrication of semiconductor, MEMS, or biotechnology devices. The method includes application of a protective thin film which typically has a thickness ranging from about 3 Å to about 1,000 Å, wherein precursor materials used to deposit the protective thin film are organic-based precursors which include at least one fluorine-comprising functional group at one end of a carbon back bone and at least one functional bonding group at the opposite end of a carbon backbone, and wherein the carbon backbone ranges in length from 4 carbons through about 12 carbons. In many applications at least a portion of the protective thin film is removed during fabrication of the devices.

27 Claims, 1 Drawing Sheet

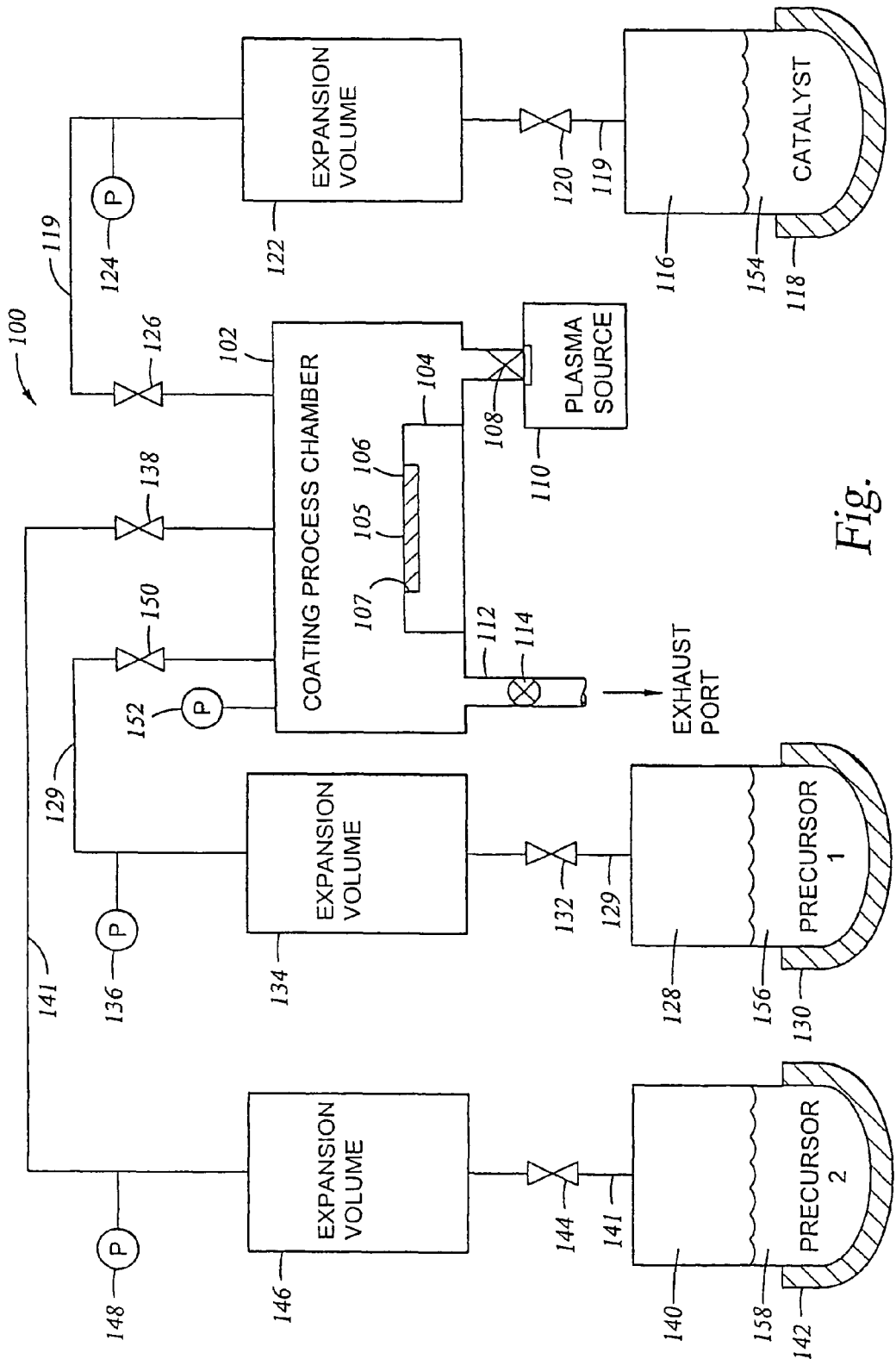

PROTECTIVE THIN FILMS FOR USE DURING FABRICATION OF SEMICONDUCTORS, MEMS, AND MICROSTRUCTURES

This application is related to U.S. application Ser. No. 10/759,857, filed Jan. 17, 2004, and entitled: Apparatus And Method For Controlled Application of Reactive Vapors To Produce Thin Films And Coatings, which is incorporated by reference herein in its entirety.

BACKGROUND OF THE INVENTION

1. Field of the Invention

The present invention pertains to a method of protecting surfaces of semiconductor devices and micro-electro-mechanical systems (MEMS) during fabrication and handling.

2. Brief Description of the Background Art

The presentation of information in this Background Art section is not an admission that any of the information is prior art to the present invention. The purpose of the information provided is to aid one skilled in the art in understanding of the invention.

Both integrated circuit (IC) device fabrication and micro-electro-mechanical systems (MEMS) fabrication make use of layers or coatings of material which are deposited on a substrate for various purposes. In some instances, the layers are deposited on a substrate and then are subsequently removed, such as when the layer is used to create a patterned masking material and then is subsequently removed after the pattern is transferred to an underlying layer. In other instances, the coating layers are deposited to perform a function in a device or system and remain as part of the fabricated device. There are numerous methods for depositing a thin film layer or a coating. In sputter deposition, a plasma is used to sputter atoms from a target material (commonly a metal), and the sputtered atoms deposit on the substrate. In chemical vapor deposition, activated (e.g. by means of plasma, radiation, or temperature, or a combination thereof) species react either in a vapor phase (with subsequent deposition of the reacted product on the substrate) or react on the substrate surface to produce a reacted product on the substrate. In evaporative deposition, evaporated material condenses on a substrate to form a layer. In spin-on, spray-on, or dip-on deposition, a coating material is applied, typically from a solvent solution of the coating material, and the solvent is subsequently evaporated to leave the coating material on the substrate.

Semiconductor and MEMS structures are often relatively fragile in nature due to their size and composition. During fabrication and handling of the devices, prior to completion of fabrication, a number of hazards may arise which cause contamination, mechanical separation, chemical corrosion, and mechanical scratching or marring of device surfaces, for example and not by way of limitation. Application of a protective coating to protect fragile surfaces at times during fabrication could be particularly beneficial. However, the protective coating should not interfere with subsequent processing of the semiconductor or MEMS device. This is complicated by the fact that it is particularly difficult to apply a coating over only a portion of the semiconductor or MEMS device surface, and a coating which may protect one portion of the device may interfere with subsequent fabrication of other portions of the device. In some instances, it is necessary to remove the protective coating from even the surface it was initially designed to protect, prior to proceeding further with fabrication.

Chlorosilanes have been widely used as a functional attachment group on organic molecules, where it is desired to bond the organic molecule to various surfaces. Typically the organic molecule containing the chlorosilane end group is either deposited from a liquid or from a vapor upon the substrate. When hydroxyl groups are present on the surface upon which a chlorosilane is deposited, the chlorosilane can be hydrolized and bonded to that surface. If the number of hydroxyl groups present on the substrate surface are inadequate to provide sufficient bonding sites to ensure a continuous coating of the surface by organic molecules presenting the chlorosilane end group, moisture may be added prior to or during deposition of the organic molecule with chlorosilane end group. An oxide layer with active hydroxyl groups which are available to react with functional organic molecules may be generated first on the surface, followed by attachment of the molecule presenting the chlorosilane end group. The other end of the functional organic molecules typically presents a functional group which provides the characteristics desired on the exterior surface of the coated substrate.

The problem with using a chlorosilane as a bonding agent is that many of the MEMS structures and semiconductor structures as a whole contain metals. Both chlorine and hydrochloric acid are particularly good at reacting with metals and tends to attack and corrode any metals which become exposed to the chlorosilane, especially when excessive concentration of moisture is present in the reaction.

An article entitled "Vapor Phase Anti-Stiction Coatings For MEMS", by W. Robert Ashurst et al., IEEE Transactions On Device Materials Reliability, Vol. 3, No. 4, December 2003, describes the development of vapor-phase anti-stiction processes for use in the fabrication of MEMS. Of the classes of precursors used for vapor deposition of anti-stiction coatings, the following were mentioned, chlorosilanes, amines, alcohols, carboxylic acids, siloxanes, and dimethylaminosilanes. The substrate surface to which the anti-stiction coatings were bonded was a silicon wafer, which is commonly used as a basic starting substrate for MEMS devices.

In the Ashurst et al. article, the specific chlorosilanes which were discussed included the following tri-chloro silanes: octadecyltrichlorosilane ($CH_3(CH_2)_{17}SiCl_3$) (OTS) which was deposited from a solution; tridecafluoro-1,1,2,2-tetrahydrooctyltirchlorosilane ($CF_3(CF_2)_5(CH_2)_2SiCl_3$) (FOTS) which was deposited from a vapor; and hepta-decafluoro-1,1,2,2-tetrahydrodecyltrichlorosilane ($CF_3(CF_2)_7(CH_2)_2SiCl_3$) (FDTS) which was deposited from both a liquid and a vapor. The dichlorosilane which was discussed was dimethyldichlorosilane (($CH_3)_2SiCl_2$) (DDMS), which was deposited from both a liquid and a vapor.

In the Ashurst et al. article, the description of the use of alcohols and amines pertained to a silicon substrate which was chlorine-terminated, which was reacted with an amine or an alcohol of the form $RNH_2$ or R—OH. The chlorine-terminated silicon substrate was prepared by exposing an H-terminated Si sample to $Cl_2$ in a vacuum while either heating the substrate to about 80° C. or illuminating it with a tungsten filament. When either R—$NH_2$ is reacted or R—)H is reacted, HCl is eliminated as a by-product. HCl is known to be particularly corrosive to metals.

In the Ashurst et al. article, the description of carboxylic acid based monolayers is limited to the instance when the substrate, structural layer is aluminum where the application is the Digital Micromirror Device or DMD™, which consists of an array of a million or more rotatable aluminum mirrors. About 50 different lubrication schemes were investigated for the DMD™. The most successful lubricants reportedly are perfluorinated n-alkanoic acids ($C_nF_{2n-1}O_2H$), which is said to form self-assembled monolayaers (SAMs) on aluminum oxide surfaces. Within this class of SAMs, perfluorodecanoic acid, where n=10 was said to be the lubricant of choice in order to minimize the friction coefficient and the possibility of thermal decomposition.

In the Ashurst et al. article, the description of the use of tris-dimethylaminosilanes specifically mentioned (tridecafluoro-1,1,2,2,-tetrahydrooctyl)tris-dimethylamino silane (PF8TAS) and (heptadecafluoro-1,1,2,2,-tetrahydrodecyl)tris-dimethylamino silane (PF10TAS). These precursors are said to not be commercially available, but to be synthesizable from their corresponding trichlorosilanes (FOTS and FDTS, respectively) and dimethylamine. It is mentioned that the aminosilane precursors are extremely sensitive to water, and must be kept rigorously anhydrous. No processing parameters are given. The aminosilane coating PF8TAS is said to have been characterized on Si(100) and on microengines.

An article entitled "Hydrophobic Coatings Using Atomic Layer Deposition and Non-Chlorinated Precursors", by C. F. Herriman et al., 0-7803-8265-X/04 ©2004 IEEE, describes a method of depositing hydrophobic coatings on MEMS devices using atomic layer deposition)(ALD) and non-chlorinated hydrophobic precursors. First, a thin film of $Al_2O_3$ is deposited via ALD and is used as a seed layer to prepare and optimize the MEMS surface for the attachment of the hydrophobic precursor. Subsequently, non-chlorinated alkylsilanes are chemically bonded to the surface hydroxyl groups on the ALD seed layer. The alkyl silane which was described in the application was tridecafluoro-1, 1,2,2-tetrahydro-octyl-methyl-bis(dimethylamino) silane $(C_8F_{13}H_4(CH_3)Si(N(CH_3)_2)_2)$.

In another publication of interest, titled "Vapor Deposition of Amino-Functionalized Self-Assembled Monolayers on MEMS", Proceedings of SPIE Vol. 4980 (2003) SPIE-0277-786X/03, Hankins et al. describe problems with stiction which occur when a device is removed from a liquid phase into ambient air. A method for dealing with stiction, which is termed VSAMS (vapor-deposited self-assembled monolayers), employs supercritical $CO_2$ drying and chemical vapor deposition to address many of the stiction concerns. Films deposited as part of the VSAMS coating deposition scheme make use of amino-functionalized silanes. The advantage of using amino-functionalized silane precursors for VSAMS is said to be related to strength of the bond between the film and an underlying polysilicon surface (as evidenced by the stability of the films made with precursors across "the entire humidity scale"). The authors indicate that there is good evidence that the films formed using perfluorinated chlorosilane precursors are not bonded as deposited directly on the silicon surface of a MEMS substrate, and require an annealing step for the coating to become firmly attached to the substrate. Films formed using perfluorinated aminosilane precursors are said to be bonded as deposited, so that an annealing step is not required. Two perfluorinated aminosilane precursors were evaluated. These were (tridecafluoro-1,1,2,2,-tetrahydrooctyl)tris(dimethylamino)silane and (heptadecafluoro-1,1,2,2,-tetrahydrodecyl)tris(dimethylamino) silane. In particular, the films formed using these precursors were applied to microengines with two orthogonal comb drive arrays to provide lubrication during operation of the microengines.

The use of vapor deposited films formed from fluorinated aminosilane and fluorinated chlorosilane precursors provides a hydrophobic surface on a substrate, and such a hydrophobic surface has been demonstrated to help prevent stiction in MEMS devices.

There are a number of functionalized silane-containing precursor materials and functionalized organic-based precursor materials which can be vapor deposited to form thin films on a variety of different substrates. One skilled in the art must develop a coating system that will provide the results which are required in a particular application. This typically requires extensive research and developmental efforts. In the present instance, the inventors were working to find thin film coatings which could act as a protective coating during processing of semiconductor substrates, or biomedical substrates, or MEMS substrates, where there may be a need to selectively remove a portion of the protective coating or to remove the entire protective coating during a fabrication process without affecting functional portions of the device which is being fabricated.

BRIEF DESCRIPTION OF THE DRAWING

The FIGURE shows a cross-sectional schematic of an apparatus 100 of the kind which can be used for vapor deposition of a thin film coating. The apparatus includes elements which enable the metering precise amounts of reactants to the coating formation process.

DETAILED DESCRIPTION OF EXEMPLARY EMBODIMENTS

The present invention pertains to the use of thin film coatings which protect semiconductor, MEMS, and microstructures, such as biotechnology substrates, in instances such as saw-based dicing, laser-based processing, during the incorporation of substrates and devices into packaging, and when moisture is present, by way of example and not by way of limitation.

In instances where the protective coating is hydrophilic, typically the devices can be protected during a wet processing application which involves the risk of substrate contamination, including, for example, chemical mechanical polishing and immersion lithography.

The thin film coatings are vapor deposited onto semiconductor, MEMS, and biotechnology substrates. The thin film coatings most commonly vary in thickness from about 3 Å to about 1,000 Å. In applications where bonding (such as electrical connection wire bonding, by way of example) is to be carried out through the surface of the coating, the thin film coating thickness typically ranges from about 5 Å to about 20 Å. The precursor materials which are used to deposit the thin film coatings are typically designed to produce a hydrophobic, low energy surface which prevents various contaminants, debris, particulates, and moisture from reaching and/or from adhering to the substrate surface which is to be protected. When contamination of the kind described above is unavoidable in the manufacturing process, the function of the thin coating is to reduce debris adhesion to the coated surface and to facilitate easier removal of the contamination and cleaning of the coated surface. For example, a gentle rinsing procedure may replace high pressure mechanical scrubbing, reducing the stress induced upon the substrate by cleaning operations, leading to a higher finished product yield.

To provide a thin film coating with a hydrophobic exterior surface, the precursor materials for coating deposition are commonly designed to provide a coating which presents a fluorine-comprising exterior surface. The most frequently used fluorine-comprising precursor materials are organic-based molecules which are perfluorinated at one end of the molecule, and which exhibit a functional bonding group which can be a chlorosilane or an aminosilane at the other end of the molecule. In instances where the presence of chlorine will damage the substrate surface which is to be protected, such as when the substrate surface includes a metal, by way of example and not by way of limitation, the functional bonding group is often an aminosilane. In instances where the presence of chlorine is not harmful, the functional bonding group may be a chlorosilane. The chlorosilane typically provides a stronger, covalent bond to the substrate surface, but requires the presence of hydroxyl groups on the surface, and may cause corrosion of the substrate surface in some instances, as mentioned above.

When the thin film coating functional bonding group is to bond to a surface which is more difficult to bond to, such as a surface which does not contain silicon or an oxide, or a surface which includes a polymer, a noble metal, or a corrosion resistant alloy metal, by way of example and not by way of limitation, the functional bonding group may be an aminosilane. The functional bonding group may also be an aminosilane when the surface is a metal or metal alloy which would be corroded by use of a chlorosilane bonding group. The aminosilane may be a mono-amine compound, a di-amine compound, or a tris-amine compound, where an increased number of amines increases the number of bonding sites and provides a stronger bond to the substrate surface. A mono-amine functional bonding group exhibits a smaller end group for attachment to the substrate, which in many instances permits closer packing of the coating molecules. A tris-amine functional bonding group permits better adhesion due to the availability of three bonding sites. In addition a portion of the amine functional bonding group may be used to cross-polymerize with other precursor molecules, to provide a coating which is mechanically stronger.

The length of the carbon chain which is present between the functional bonding group end of the organic-based molecule and the fluorine-comprising end of the organic-based molecule significantly affects the performance of the thin film coating. In general, a carbon chain which contains more than 3 carbons, up through about 12 carbons has been demonstrated to provide good to excellent performance. Typically a carbon chain which contains from 8 up to 10 carbons performs particularly well for most applications. A table is provided subsequently herein which lists the observed performance for a number of different precursor materials which can be used to form the thin film coatings. In general, a perfluorinated molecular chain which contains more than 8 carbons in the chain backbone produces a vapor deposited coating which is very hydrophobic, to the extent that the coating surface becomes difficult to bond to by common adhesives, for example. As the number of carbons in the molecular chain backbone decreases, the hydrophobicity of the deposited coating surface decreases.

When it is desired to selectively remove a portion of a thin film organic-based coating this can be done using ultraviolet radiation treatment, or an oxygen plasma, by way of example and not by way of limitation. Selective removal requires use of some kind of masking, for example physical doping or a shadow mask, by way of example and not by way of limitation. When it is desired to use overall or localized thermal treatment to remove at least a portion of a thin film organic-based coating, and other variables such as the functional bonding group(s) are held constant, it is advantageous to use a carbon chain which contains less than 8 carbons, and typically in the range of 4 to 6 carbons, since such short chain films tend to be less stable at higher temperatures. Treatment at temperatures ranging from about 250° C. to about 350° C. may be used when amino silane bonding groups are used as the organic precursor to substrate bonding groups. Higher temperatures, in the range of about 400° C. to about 600° C. are typically required when a chlorosilane bonding group is used. When abrasion is used as a localized treatment for removal of at least a portion of a protective thin film coating, for example, when micro scratching or micro vibration abrasion is used, this may be accomplished at loser temperatures in the range of about 50° C. to about 100° C., by way of example and not by way of limitation. The increase in temperature over room temperature is due to heat generated by abrasion of the substrate surface.

The vapor deposited thin film coatings discussed above are particularly useful when applied prior to saw based dicing of semiconductor device substrates. Debris which would ordinarily form on the device surface is collected on top of the thin film coating, and is easily removed using conventional cleaning techniques known in the industry. When laser-based scribing or separation of devices out of a large substrate is carried out, the thin film coating reduces the potential for damage to underlying substrate, while protecting the surface of the substrate from residues formed during the laser processing. When the separation of individual chips or device structures from a large substrate is complete, the vapor deposited thin film coatings may be rinsed with a spray to remove any loose debris or residue. If it is desired to remove the thin film coating entirely from the separated chips or device structures, after removal of loose debris or residue, the coating can be removed by thermal treatment or by oxidation in oxygen by means of an RF plasma or U.V. radiation. In a few cases, it may also be possible to remove a thin film coating having a hydrophobic surface by immersion of a coated substrate in water when the functional bonding group is not bonded strongly to the substrate or is unstable in water.

In some applications, it may be helpful to selectively remove the thin film coating from a portion of the substrate surface, while leaving the thin film coating on other areas of the substrate surface. For example, in a semiconductor substrate, where the thin film coating has been applied to protect the surface of the substrate or to prevent contact of the surface of the substrate by moisture, and an electrical contact needs to be made through the thin film coating, the thin film coating can be removed in the contact area by application of a hot wire, by way of example. If it is desired to use an adhesive to attach a cover or adjunct device, the substrate can be patterned, followed by application of UV radiation and/or UV ozone, or an oxidizing plasma, as a method of removing the thin film coating from substrate surfaces which are to be adhered.

In general, the vapor deposited thin films presenting a fluorinated surface are too thin to provide substantial structural support; however, they provide a protective, low energy surface (which avoids adhesion), as well as assist in preventing moisture from reaching the underlying substrate surface. If it is desired to completely remove a thin film coating from a substrate surface, this can be accomplished using ultraviolet radiation treatment or an oxygen-containing plasma, without exposing the substrate to solvents. The ability to protect a packaged device active areas both during manufacturing and, if desired, during in-use product applications, while selectively removing the thin film coating in the areas required for strong adhesion in processes such as encapsulation or bonding is unique to the method described herein.

The thin film coatings which are used in the applications described above may be applied from a liquid phase or from a vapor phase. However, where precision coating is required to completely cover nanometer-size features, vapor phase coating is preferred. We previously disclosed the development of an improved vapor-phase deposition method and apparatus for the application of layers and coatings on substrates. This method and apparatus are described in U.S. patent application Ser. No. 10/759,857, filed Jan. 17, 2004, and entitled: "Apparatus And Method For Controlled Application of Reactive Vapors To Produce Thin Films And Coatings". The method and apparatus are useful in the fabrication of electronic devices, micro-electromechanical systems (MEMS), Bio-MEMS devices, and microfluidic devices. The coating formation method employs a batch-like addition and mixing of all of the reactants to be consumed in a given step of a coating formation process. The coating formation process may be complete after one step, or may include a number of individual steps, where different or repetitive reactive processes are carried out in each individual step. The apparatus used to carry out the method provides for the addition of a precise amount of each of the reactants to be consumed in a single reaction step of the coating formation process. The apparatus may provide for precise addition of quantities of different combinations of reactants during a single step or when there are a number of different individual steps in the coating formation process. The precise addition of each of the reactants is based on a metering system where the amount of reactant added in an individual step is carefully controlled. In one embodiment of the coating formation method, the reactant in vapor form is metered into a vapor reservoir with a predetermined set volume at a specified temperature to a specified pressure to provide a highly accurate amount of reactant. The entire measured amounts(s) of each reactant is (are) transferred in batch fashion into the process chamber in which the coating is formed. The order in which each reactant is added to the chamber for a given reaction step is selectable, and may depend on the relative reactivities of the reactants when there are more than one reactant, the need to have one reactant or the catalytic agent contact the substrate surface first, or a balancing of these considerations.

In some instances, it may be necessary to carry out a series of individual vapor delivery steps to provide a complete coating, rather than carrying out one continuous reaction process. This is the case when very small features, such as openings or channels need to be filled to obtain continuous surface coverage. All of a precisely measured quantity of reacting component or components are charged to the thin film vapor deposition processing chamber; the reacting component is reacted, and the residue in the processing chamber is pumped out; and the process is repeated a number of times until a continuous thin film coating is formed over the entire substrate surface.

A computer driven process control system may be used to provide for a series of additions of reactants to the process chamber in which the thin film coating is being formed. This process control system typically also controls other process variables, such as, (for example and not by way of limitation), process time, chamber pressure, temperatures of the process chamber and the substrate to which the coating is applied, as well as temperatures of the vapor delivery lines and vapor reservoirs relative to the temperatures of the coating precursor materials and catalysts (when used).

The apparatus for vapor deposition of coatings is particularly useful for deposition of coatings having a thickness ranging from about 3 Å to about 1,000 Å, with thicknesses ranging from about 5 Å to about 500 Å being more common. The apparatus described can be used to deposit coatings from low vapor pressure precursor materials, which exhibit a vapor pressure below about 150 Torr at a temperature of 25° C. The precursor materials described subsequently herein typically exhibit a vapor pressure at 25° C. which ranges from about 0.5 Torr to about 10 Torr, and more typically from about 0.5 Torr to about 5 Torr. The apparatus includes at least one precursor container in which at least one precursor, in the form of a liquid or solid, is placed; at least one precursor vapor reservoir for holding vapor of the at least one precursor; at least one device which controls precursor vapor flow from the precursor container into the precursor vapor reservoir; a pressure sensor in communication with the precursor vapor reservoir; a process controller which receives data from the pressure sensor, compares the data with a desired nominal vapor reservoir pressure, and sends a signal to a device which allowa vapor flow from the precursor container into the precursor vapor reservoir, to prevent further vapor flow into the precursor vapor reservoir when the desired nominal pressure is reached; a device which controls precursor vapor flow into the precursor vapor reservoir upon receipt of a signal from the process controller; a process chamber for vapor deposition of the coating on a substrate present in the process chamber; and a device which controls precursor vapor flow into the process chamber upon receipt of a signal from the process controller.

In some instances, the apparatus includes a device which applies heat to the precursor while it is in the container, to produce a vaporous phase of the precursor. The apparatus may include at least one catalyst container, in which a catalyst, in the form of a liquid or a solid is placed; and a catalyst vapor reservoir for holding vapor of the catalyst, with the same basic elements facilitating transfer of catalyst to the process chamber as those described with reference to a precursor.

As a preface to an even more detailed description, including examples, it should be noted that, as used in this specification and the appended claims, the singular forms "a", "an", and "the" include plural referents, unless the context clearly dictates otherwise.

We have developed a series of vapor deposited thin film coatings which can be used to provide protection of substrate surfaces during particular processing activities which are a part of product fabrication. The thin film coatings may be left on the substrate or may be selectively removed from specific areas of the substrate surface under particular conditions to promote fabrication activities. The thin film coatings have application in semiconductor substrate processing, in bio-functional substrate processing, and in MEMS processing. The thin film coatings are vapor deposited from functional organic-based precursors which provide a functional bonding group at one end of the organic molecule and present a second, surface functional group at the other end of the organic molecule. After formation of the thin film coating, the functional bonding group is attached to the substrate surface, and the surface functional group provides functionality at the exposed surface of the thin film coating.

There are a number of precursor materials which are known in the art which can be used to vapor deposit thin film coatings. However only a very few, those described herein, are practically useful to solve the problems which are encountered during processing of microdevices of the kind which are used in semiconductor device substrates, bio-functional device substrates, and in MEMS. We have vapor deposited a series of protective thin film coatings and evaluated their performance for particular end-use applications. We have used a specialized method of vapor deposition which permits a precise deposition of a uniform thin film coating where the thickness of the coating is typically less than about 1,000 Å. The series of uniform thin film coatings developed have been designed to permit removal under specific process conditions without harm to the underlying substrate. The protective coatings may be selectively removed from portions of the substrate over which the coating is applied.

The protective coatings are particularly useful when individual devices need to be separated from other individual devices which are present on a single substrate. This is the case for semiconductor devices, biotechnology devices, and MEMS in many instances, because it is more economically to fabricate a number of devices on a single substrate and then to separate the devices for subsequent use by the consumer. Separation of individual devices from a single substrate is typically accomplished by techniques such as saw-based dicing, laser-based processing, and scribe and break. In many of the separation processes, it is desired to protect at least a portion of the surface of the substrate from the accumulation of large particles and chemical residues which may be created by the separation process.

For example, in semiconductor processing, adhered debris and inclusions generated during a separation process may become the cause of localized heating problems and stress points during subsequent packaging and during use of a separated device. The smaller the features in the device, the less tolerant the device is to surface debris, which may cause overheating and/or shorting, leading to defective electronic signals. The drive to use thinner substrates, for purposes of package size reduction and thermal management concerns has contributed to mechanical stress generation problems during the separation of devices from a large substrate. Protection from moisture during dicing and packaging is an issue for low k dielectric materials which tend to be porous in nature, and damage to delicate porous structure seriously affects performance of semiconductor devices. With respect to bio-technology, similar considerations exist with respect to dicing and packaging of laboratory devices.

The articles related to MEMS devices which were described in the Background Art presented above provide numerous examples where moving parts of the MEMS device require protection from debris and moisture during fabrication in order to maintain functionality of the micro-mechanical parts.

As previously mentioned, the selectively removable, thin film coatings may be deposited from liquid precursors or may be vapor deposited, depending on the requirements of the product application. When small feature sizes are involved, such as in production of semiconductor, MEMS, and biotechnology substrates, vapor deposition is frequently the preferred method of coating deposition. The thin film coatings most commonly vary in thickness from about 3 Å to about 1,000 Å.

The precursor materials which are used to deposit the coatings are typically designed to produce a low energy hydrophobic surface, which reduces the adhesion of debris which may accumulate on the surface, and which typically prevents moisture and liquids from reaching and wetting the substrate surface which is to be protected. When a hydrophobic surface is required, the precursor materials for coating deposition are most commonly fluorine-comprising. The most frequently used fluorine-comprising precursor materials are organic-based molecules which are perfluorinated at one end of the molecule, and which exhibit a functional bonding group such as a chlorosilane or an aminosilane at the other end of the molecule. In instances where the presence of chlorine or reactant byproducts such as HCl, or moisture will damage the substrate surface which is to be protected, such as when the substrate surface includes a metal, by way of example and not by way of limitation, the functional bonding group is typically an aminosilane. In instances where the protective coating needs to be more durable, and the substrate will not be harmed by the presence of moisture, chlorine, or HCl, the functional bonding group is typically a chlorosilane.

When the selectively removable, thin film coating functional bonding group is to bond to a surface which is more difficult to bond to, such as a surface which does not contain silicon, or a surface which includes a noble metal or a corrosion resistant alloy metal, by way of example and not by way of limitation, the functional bonding group is typically an aminosilane. The aminosilane may be a mono-amine compound, a di-amine compound, or a tris-amine compound. A mono-amine functional bonding group exhibits a smaller end group for attachment to the substrate, which permits closer packing. A tris-amine functional bonding group permits better adhesion to "hard to bond to" substrates, due to the availability of three bonding sites. Further, the additional bonding groups permit cross-polymerization between individual molecules (referred to as cross-linking) which makes the coatings more structurally stable.

The length of the carbon chain which is present between the functional bonding group end of the organic-based molecule and the fluorine-comprising (or other functional) end of the organic-based molecule significantly affects the performance of the thin film coating. In general, a carbon chain which contains more than 3 carbons, up through about 12 carbons has been demonstrated to provide good to excellent performance. Typically a carbon chain which contains from 6 up through 10 carbons performs particularly well for most applications. The Table below provides a listing of the observed performance for a number of different precursor materials which can be used to form the protective, thin film coatings. In general, a perfluorinated molecular chain which contains more than 8 carbons produces a vapor deposited coating which is too hydrophobic for an epoxy and other similar adhesive materials to adhere to the coating surface. Selective removal of the thin film coating may be used to promote adhesion to the substrate surface in these areas where adhesion is required, such in particular packaging areas. A perfluorinated molecular chain which contains less than 6 carbons exhibits a decreasing hydrophobic property as the number of carbons in the perfluorinated molecular chain decreases.

TABLE

PRECURSOR MATERIALS FOR FORMING PROTECTIVE REMOVABLE VAPOR-DEPOSITED THIN FILMS

| Total Carbons in Polymer Chain Backbone | Functional Bonding Group | Name Abbrev. | Common Chemical Name | Scientific Chemical Name | Performance Of Vapor Deposited Thin Film in Packaging Applications |
|---|---|---|---|---|---|
| 3 | dichlorosilane | TFPMDC | 3,3,3-trifluoropropyl-methyl-dichlorosilane | 3,3,3,trifluoropropyl-methyl-dichlorosilane | carbon chain is too short. The film is less stable. |
| 6 | mono-dimethylamino- | PF6MAS | perfluoro-hexyl-dimethyl- | nonafluoro-1,1,2,2,- | Good Performance |

TABLE-continued

PRECURSOR MATERIALS FOR FORMING PROTECTIVE REMOVABLE VAPOR-DEPOSITED THIN FILMS

| Total Carbons in Polymer Chain Backbone | Functional Bonding Group | Name Abbrev. | Common Chemical Name | Scientific Chemical Name | Performance Of Vapor Deposited Thin Film in Packaging Applications |
|---|---|---|---|---|---|
|  | silane |  | dimethylamino-silane | tetrahydrohexyl-dimethyl-(dimethylamine) silane | for most hydrophobic applications, but weaker adhesion to the substrate. |
| 6 | tris-dimethylamino-silane | PF6TAS | perfluoro-hexyl-tris-dimethylamino-silane | nonafluoro-1,1,2,2,-tetrahydrohexyl-(tris-dimethylamino) silane | Good Performance. The film exhibits improved adhesion, and better resistance to solvents due to cross-linking. |
| 6 | tri-chlorosilane | FHTS | perfluoro-hexyl-trichlorosilane | nonafluoro-1,1,2,2-tetrahydrohexyl trichlorosilane | Strong bonding to silicon, and good protection of the surface, but possible corrosion. |
| 8 | mono-dimethylamino-silane? | PF8MAS | perfluoro-octyl-dimethyl-dimethylamino-silane | tridecafluoro-1,1,2,2,-tetrahydrooctyl-(dimethylamino) silane | Good Performance in general, but lower adhesion and cross-linking than tris amino silanes. |
| 8 | tris-dimethylamino-silane | PF8TAS | perfluoro-octyl-tris-dimethylamino-silane | tridecafluoro-1,1,2,2-tetrahydrooctyl-(tris-dimethylamino) silane | Good Performance in general, with improved adhesion and crosslinking. |
| 8 | tri-chlorosilane | FOTS | perfluoro-octyltrichlorosilane | tridecafluoro-1,1,2,2-tetrahydrooctyltrichlorosilane | Strong bonding to silicon, and good protection of the surface, but possible corrosion. |
| 10 | mono-dimethylamino silane | PF10MAS | perfluoro-decyl-dimethyl-dimethylamino-silane | heptadecafluoro-1,1,2,2,-tetrahydrodecyl-dimethyl-(dimethylamino) silane | Moderately good performance, but weaker adhesion and limited crosslinking. |
| 10 | tris-dimethylamino-silane | PF10TAS | perfluoro-decyl-tris-dimethylamino-silane | heptadecafluoro-1,1,2,2-tetrahydrodecyl-(tris-dimethylamino) silane | Good performance, in general. |
| 10 | tri-chlorosilane | FDTS | perfluoro-decyltrichlorosilane | heptadecafluoro-1,1,2,2-tetrahydrodecyltrichlorosilane | Good performance, but substrate limited. |
| 12 | mono-dimethylamino-silane | PF12MAS | perfluoro-dodecyl-dimethyl-dimethylamino-silane | icosakaihena-fluoro-1,1,2,2,-tetrahdro-dodecyl-dimethyl- | Weaker adhesion and crosslinking than the tris-dimethylamino |

TABLE-continued

PRECURSOR MATERIALS FOR FORMING PROTECTIVE REMOVABLE VAPOR-DEPOSITED THIN FILMS

| Total Carbons in Polymer Chain Backbone | Functional Bonding Group | Name Abbrev. | Common Chemical Name | Scientific Chemical Name | Performance Of Vapor Deposited Thin Film in Packaging Applications |
|---|---|---|---|---|---|
| | | | | (dimethylamino) silane | silanes. |
| 12 | tris-dimethylamino-silane | PF12TAS | perfluoro-dodecyl-tris-dimethylamino-silanel | icosakaihena-fluoro-1,1,2,2-tetrahydro-dodecyl-(tris-dimethylamino) silane | Good performance, but more difficult to process due to lower vapor pressure. |
| 12 | tri-chlorosilane | FDDTS | perfluoro-dodecyltrichlorosilane | icosakaihena-fluoro-1,1,2,2-tetrahydrododecyltrichlorosilane | Good performance, but more diffucilt to process due to lower vapor pressure. Substrate limited. |

The thin film vapor deposited thin film coatings discussed above are particularly useful when applied prior to saw based dicing of semiconductor device substrates. Debris which would ordinarily form on the device surface is collected on top of the thin film coating and is removed when the coating is removed by rinsing or other cleaning techniques known in the art. When laser-based separation of devices out of a large substrate is carried out, the thin film coating provides a protective layer which reduces the potential for damage to underlying substrate, while protecting the surface of the substrate from residues formed during the laser processing. When the separation of individual chips or device structures from a large substrate is complete, the thin film vapor deposited thin film coatings may be rinsed with a spray to remove any loose debris or residue. The thin film coating may then be selectively removed in areas or may be removed as a whole by treatment with ultraviolet radiation (typically in the presence of oxygen), or by plasma etching (typically with an oxygen-containing plasma). In some instances thermal treatment of the kind previously described may be used, depending on the substrate. The removal conditions depend on the functional bonding group, and the overall composition of the thin film coating.

In some applications, it may be especially helpful to selectively remove the thin film coating from a portion of the substrate surface, while leaving the thin film coating on other areas of the substrate surface. For example, in a semiconductor substrate, where the thin film coating has been applied to protect the surface of the substrate from the accumulation of particulates or rigorous cleaning processes, and an electrical contact needs to be made through the surface of the coating after the protected process steps. In such instances, the thin film coating can be removed in the contact area by application of a hot wire or other localized heating, or by abrasion techniques such as microscratching or microvibration. If it is desired to use an adhesive to attach a cover or adjunct device, this may be accomplished after patterning the surface of the coating, followed by treatment with ultraviolet radiation (frequently in the presence of oxygen) or plasma etching (often using an oxygen-containing plasma), so that the coating ins removed in the area to be adhered to, as previously described.

In applications such as wire bonding, it is frequently adequate to penetrate the thin film coating at a particular location, without removal of the coating in general, by the localized application of heat or by localized abrasion, as described above.

In instances where the damage to a semiconductor substrate, a biotechnology substrate, or a MEMS device is caused by the accumulation of particles and/or the exposure to a wet environment (such as the presence of moisture during processing), the thin film coatings can be used to reduce the amount of damage. The fluorine-containing hydrophobic thin film coatings are helpful in preventing moisture from condensing onto the substrate surface. Thin film selective removal using a technique selected from the group consisting of thermal decomposition, U.V. radiation, plasma etching, and combinations thereof allows one skilled in the art to remove a protective coating from a substrate area without exposure of the substrate to moisture or solvents.

We previously disclosed the development of an improved vapor-phase deposition method and apparatus for the application of layers and coatings on substrates. This method and apparatus are described in U.S. patent application Ser. No. 10/759,857, filed Jan. 17, 2004, and entitled: "Apparatus And Method For Controlled Application of Reactive Vapors To Produce Thin Films And Coatings". The method and apparatus are useful in the fabrication of electronic devices, microelectromechanical systems (MEMS), Bio-MEMS devices, and microfluidic devices. The coating formation method employs a batch-like addition and mixing of all of the reactants to be consumed in a given step of a coating formation process. The coating formation process may be complete after one step, or may include a number of individual steps, where different or repetitive reactive processes are carried out in each individual step. The apparatus used to carry out the method provides for the addition of a precise amount of each of the reactants to be consumed in a single reaction step of the coating formation process. The apparatus may provide for precise addition of quantities of different combinations of reactants during a single step or when there are a number of different individual steps in the coating formation process. The precise addition of each of the reactants is based on a metering system where the amount of reactant added in an individual step is carefully controlled. In one embodiment of the coating formation method, the reactant in vapor form is metered into a vapor reservoir with a predetermined set volume at a specified temperature to a specified pressure to provide a highly accurate amount of reactant. The entire measured amounts(s) of each reactant is (are) transferred in batch fashion into the process chamber in which the coating is formed. The order in which each reactant is added to the chamber for a given reaction step is selectable, and may depend on the relative reactivities of the reactants when there are more than one reactant, the need to have one reactant or the catalytic agent contact the substrate surface first, or a balancing of these considerations.

In some instances, it may be necessary to carry out a series of individual vapor delivery steps to provide a complete coating, rather than carrying out one continuous reaction process. This is the case when very small features, such as openings or channels need to be filled to obtain continuous surface coverage. All of a precisely measured quantity of reacting component or components are charged to the thin film vapor deposition processing chamber; the reacting component is reacted, and the residue in the processing chamber is pumped out; and the process is repeated a number of times until a continuous thin film coating is formed over the entire substrate surface.

A computer driven process control system may be used to provide for a series of additions of reactants to the process chamber in which the thin film coating is being formed. This process control system typically also controls other process variables, such as, (for example and not by way of limitation), process time, chamber pressure, temperatures of the process chamber and the substrate to which the coating is applied, as well as temperatures of the vapor delivery lines and vapor reservoirs relative to the temperatures of the coating precursor materials and catalysts (when used).

The apparatus for vapor deposition of coatings is illustrated in FIG. 1. FIG. 1 shows a cross-sectional schematic of an apparatus 100 for vapor deposition of thin coatings. The apparatus 100 includes a process chamber 102 in which thin (typically 3 Å to 1,000 Å thick) coatings are vapor deposited. A substrate 106 to be coated rests upon a substrate holder 104, typically within a recess 107 in the substrate holder 104. Depending on the chamber design, the substrate 106 may rest on the chamber bottom (not shown in this position in FIG. 1). Attached to process chamber 102 is a remote plasma source 110, connected via a valve 108. Remote plasma source 110 may be used to provide a plasma which is used to clean and/or convert a substrate surface to a particular chemical state prior to application of a coating (which enables reaction of coating species and/or catalyst with the surface, thus improving adhesion and/or formation of the coating); or may be used to provide species helpful during formation of the coating (not shown) or modifications of the coating after deposition. The plasma may be generated using a microwave, DC, or inductive RF power source, or combinations thereof. The process chamber 102 makes use of an exhaust port 112 for the removal of reaction byproducts and is opened for pumping/purging the chamber 102. A shut-off valve or a control valve 114 is used to isolate the chamber or to control the amount of vacuum applied to the exhaust port. The vacuum source is not shown in FIG. 1.

The apparatus 100 shown in FIG. 1 is illustrative of a vapor deposited coating which employs two precursor materials and a catalyst. One skilled in the art will understand that one or more precursors and from zero to multiple catalysts may be used during vapor deposition of a coating. A catalyst storage container 116 contains catalyst 154, which may be heated using heater 118 to provide a vapor, as necessary. It is understood that precursor and catalyst storage container walls, and transfer lines into process chamber 102 will be heated as necessary to maintain a precursor or catalyst in a vaporous state, minimizing or avoiding condensation. The same is true with respect to heating of the interior surfaces of process chamber 102 and the surface of substrate 106 to which the coating (not shown) is applied. A control valve 120 is present on transfer line 119 between catalyst storage container 116 and catalyst vapor reservoir 122, where the catalyst vapor is permitted to accumulate until a nominal, specified pressure is measured at pressure indicator 124. Control valve 120 is in a normally-closed position and returns to that position once the specified pressure is reached in catalyst vapor reservoir 122. At the time the catalyst vapor in vapor reservoir 122 is to be released, valve 126 on transfer line 119 is opened to permit entrance of the catalyst present in vapor reservoir 122 into process chamber 102 which is at a lower pressure. Control valves 120 and 126 are controlled by a programmable process control system of the kind known in the art (which is not shown in FIG. 1).

A Precursor 1 storage container 128 contains coating reactant Precursor 1, which may be heated using heater 130 to provide a vapor, as necessary. As previously mentioned, Precursor 1 transfer line 129 and vapor reservoir 134 internal surfaces are heated as necessary to maintain a Precursor 1 in a vaporous state, avoiding condensation. A control valve 132 is present on transfer line 129 between Precursor 1 storage container 128 and Precursor 1 vapor reservoir 134, where the Precursor 1 vapor is permitted to accumulate until a nominal, specified pressure is measured at pressure indicator 136. Control valve 132 is in a normally-closed position and returns to that position once the specified pressure is reached in Precursor 1 vapor reservoir 134. At the time the Precursor 1 vapor in vapor reservoir 134 is to be released, valve 138 on transfer line 129 is opened to permit entrance of the Precursor 1 vapor present in vapor reservoir 134 into process chamber 102, which is at a lower pressure. Control valves 132 and 138 are controlled by a programmable process control system of the kind known in the art (which is not shown in FIG. 1).

A Precursor 2 storage container 140 contains coating reactant Precursor 2, which may be heated using heater 142 to provide a vapor, as necessary. As previously mentioned, Precursor 2 transfer line 141 and vapor reservoir 146 internal surfaces are heated as necessary to maintain Precursor 2 in a vaporous state, avoiding condensation. A control valve 144 is present on transfer line 141 between Precursor 2 storage container 146 and Precursor 2 vapor reservoir 146, where the Precursor 2 vapor is permitted to accumulate until a nominal, specified pressure is measured at pressure indicator 148. Control valve 141 is in a normally-closed position and returns to that position once the specified pressure is reached in Precursor 2 vapor reservoir 146. At the time the Precursor 2 vapor in vapor reservoir 146 is to be released, valve 150 on transfer line 141 is opened to permit entrance of the Precursor 2 vapor present in vapor reservoir 146 into process chamber 102, which is at a lower pressure. Control valves 144 and 150 are controlled by a programmable process control system of the kind known in the art (which is not shown in FIG. 1).

During formation of a coating (not shown) on a surface 105 of substrate 106, at least one incremental addition of vapor equal to the vapor reservoir 122 of the catalyst 154, or the vapor reservoir 134 of the Precursor 1, or the vapor reservoir 146 of Precursor 2 may be added to process chamber 102. The total amount of vapor added is controlled by both the adjustable volume size of each of the expansion chambers (typically 50 cc up to 1,000 cc) and the number of vapor injections (doses) into the reaction chamber. Further, the process control system (not shown) may adjust the set pressure 124 for catalyst vapor reservoir 122, or the set pressure 136 for Precursor 1 vapor reservoir 134, or the set pressure 148 for Precursor 2 vapor reservoir 146, to adjust the amount of the catalyst or reactant added to any particular step during the coating formation process. This ability to fix precise amounts of catalyst and coating reactant precursors dosed (charged) to the process chamber 102 at any time during the coating formation enables the precise addition of quantities of precursors and catalyst at precise timing intervals, providing not only accurate dosing of reactants and catalysts, but repeatability in terms of time of addition.

This apparatus provides a very inexpensive, yet accurate method of adding vapor phase precursor reactants and catalyst to the coating formation process, despite the fact that many of the precursors and catalysts are typically relatively non-volatile materials. In the past, flow controllers were used to control the addition of various reactants; however, these flow controllers may not be able to handle some of the precursors used for vapor deposition of coatings, due to the low vapor pressure and chemical nature of the precursor materials. The rate at which vapor is generated from some of the precursors is generally too slow to function with a flow controller in a manner which provides availability of material in a timely manner for the vapor deposition process.

The apparatus specifically described herein allows for accumulation of the vapor into an adequate quantity which can be charged (dosed) to the reaction. In the event it is desired to make several doses during the progress of the coating deposition, the apparatus can be programmed to do so, as described above. Additionally, adding of the reactant vapors into the reaction chamber in controlled aliquots (as opposed to continuous flow) greatly reduces the amount of the reactants used and the cost of the coating process.

In some instances of vapor deposited coatings, for example when aminosilane functional bonding groups are used in a precursor material, and it is not necessary to inject water or a catalyst into the system, the vapor deposition coating scheme may employ a carrier gas in combination with the coating precursor or precursors, typically with a continuous flow of reactants across a substrate surface during coating deposition. This permits the use of continuous flow processing apparatus of the kind generally known in the art, as an alternative to the apparatus described above. However, one skilled in the art will recognize that with respect to some precursors, there are advantages to a stagnant surface reaction which cannot be achieved when a gas is constantly flowing over the substrate surface.

The above described exemplary embodiments are not intended to limit the scope of the present invention, as one skilled in the art can, in view of the present disclosure expand such embodiments to correspond with the subject matter of the invention claimed below.

We claim:

1. A method of protecting a substrate during fabrication of semiconductor or MEMS devices, the method comprising:
receiving a substrate during fabrication of semiconductor or MEMS devices;
applying a thin film coating over said substrate, said thin film coating having a thickness ranging from about 3 angstroms to about 1,000 angstroms, wherein a precursor material used to deposit said thin film coating is an organic-based precursor which includes at least one fluorine-comprising functional group at one end of a carbon back bone and at least one functional bonding group at the opposite end of said carbon backbone, wherein said carbon backbone ranges in length from 4 carbons to about 12 carbons;
performing a process operation on the substrate after applying the thin film coating, the thin film coating protecting the substrate during the performance of the process operation; and
selectively removing portions of said thin film coating from the substrate after performing the process operation to expose areas for connection to adjunct devices.

2. A method in accordance with claim 1, wherein said thin film coating is applied using a vapor deposition technique.

3. A substrate protection method in accordance with claim 1 or claim 2, wherein said carbon backbone ranges in length from 4 carbons to 8 carbons.

4. A substrate protection method in accordance with claim 1 or claim 2, wherein said functional bonding groups range in number from one to three.

5. A substrate protection method in accordance with claim 4, wherein at least one of said functional bonding groups is a chlorosilane.

6. A substrate protection method in accordance with claim 4, wherein at least one of said functional bonding group is an aminosilane.

7. A substrate protection method in accordance with claim 1 or claim 2, wherein said portions of the thin film coating are selectively removed during said fabrication process using a technique selected from the group consisting of thermal treatment, abrasion, ultraviolet radiation treatment, ozone treatment, plasma etching, and combinations thereof.

8. A method in accordance with claim 7, wherein said technique is plasma etching, and said plasma is an oxygen-comprising plasma.

9. A method in accordance with claim 1, wherein the areas for connection include at least one electrical contact area of the substrate for formation of an electrical contact with an adjunct device.

10. A method in accordance with claim 1, wherein the areas for connection include at least one adhesive region of the substrate for bonding to an adjunct device.

11. A method in accordance with claim 1, wherein the devices are MEMS devices, the thin film coating protecting the MEMS devices by preventing stiction in the MEMS devices.

12. A method of protecting a semiconductor or MEMS substrate during packaging, comprising:
receiving a substrate during packaging of semiconductor or MEMS devices;
applying a protective hydrophobic coating over said substrate, said protective hydrophobic coating having a thickness ranging from about 3 angstroms to about 1,000 angstroms;
performing a packaging operation on the substrate after applying the protective hydrophobic coating, the protective hydrophobic coating protecting the substrate during the performance of the packaging operation; and
selectively removing a portion of said protective hydrophobic coating after performing the packaging operation to permit assembly of said packaging.

13. A method in accordance with claim 12, wherein said protective hydrophobic coating is fluorine-comprising.

14. A method in accordance with claim 13, wherein said protective hydrophobic coating is deposited from an organic-based precursor which includes at least one fluorine-comprising functional group at one end of a carbon back bone and at least one functional bonding group at the opposite end of said carbon backbone, wherein said carbon backbone ranges in length from 4 carbons to about 12 carbons.

15. A method in accordance with claim 12, wherein said protective hydrophobic coating is deposited using a vapor deposition technique.

16. A method in accordance with claim 14 or claim 15, wherein said carbon backbone ranges in length from 4 carbons to 8 carbons.

17. A method in accordance with claim 14 or claim 15, wherein said functional bonding groups range in number from one to three.

18. A method in accordance with claim 17, wherein at least one of said functional bonding groups is a chlorosilane.

19. A method in accordance with claim 17, wherein at least one of said functional bonding group is an aminosilane.

20. A method in accordance with claim 12, wherein selective removal of said portion of said protective hydrophobic coating is carried out using a technique selected from the group consisting of thermal treatment, abrasion, ultraviolet radiation treatment, ozone treatment, plasma etching, and combinations thereof.

21. A method in accordance with claim 20, wherein said technique is plasma etching, and said plasma is an oxygen-comprising plasma.

22. A method of protecting a substrate during separation of individual devices from said substrate, comprising:
   receiving a substrate;
   applying a thin film coating onto said substrate, said thin film coating having a thickness ranging from about 3 angstroms to about 1,000 angstroms, wherein precursor materials used to deposit said thin film coating are organic-based precursors which include at least one fluorine-comprising functional group at one end of a carbon back bone and at least one functional bonding group at the opposite end of a carbon backbone, wherein said carbon backbone ranges in length from 4 carbons to about 12 carbons;
   performing a separation process on the substrate to separate individual devices, said thin film coating protecting the individual devices from debris generated during the separation of the individual devices; and
   selectively removing portions of said thin film coating from the individual devices following separation of the individual devices.

23. A method in accordance with claim 22, wherein said thin film coating is vapor deposited over said substrate prior to the separation of individual devices from said substrate.

24. A method in accordance with claim 22, wherein, subsequent to deposition of said thin film coating, said substrate is processed using a laser.

25. A method in accordance with claim 22, wherein said selective removal of portions of the thin film coating from said individual devices provides a surface for adhesion during packaging of said individual devices.

26. A method in accordance with claim 22, wherein said thin film protects said substrate by preventing moisture from entering a sensitive surface of said substrate.

27. A method in accordance with claim 22, wherein said thin film protects said substrate by reducing the adhesion of debris to a surface of the substrate, whereby removal of said debris is facilitated.

* * * * *